United States Patent
Dhaliwal

(10) Patent No.: US 6,272,657 B1
(45) Date of Patent: Aug. 7, 2001

(54) APPARATUS AND METHOD FOR PROGAMMABLE PARAMETRIC TOGGLE TESTING OF DIGITAL CMOS PADS

(75) Inventor: Surinderjit S. Dhaliwal, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/421,446

(22) Filed: Oct. 19, 1999

(51) Int. Cl.$^7$ ............ G01R 31/30; G06F 11/00; G11C 29/00
(52) U.S. Cl. ............ 714/745; 714/721
(58) Field of Search .................. 714/724, 725, 714/726, 727, 729, 745

(56) References Cited

U.S. PATENT DOCUMENTS

| | | | |
|---|---|---|---|
| 5,005,173 | * 4/1991 | Martin | 714/734 |
| 5,115,191 | 5/1992 | Yoshimori | 324/158 R |
| 5,115,435 | * 5/1992 | Langford, II et al. | 714/727 |
| 5,155,733 | * 10/1992 | Blecha, Jr. | 714/733 |
| 5,166,937 | * 11/1992 | Blecha, Jr. | 714/733 |
| 5,260,948 | 11/1993 | Simpson et al. | 371/22.3 |
| 5,331,571 | * 7/1994 | Aronoff et al. | 716/4 |
| 5,363,381 | * 11/1994 | Hasegawa | 714/724 |
| 5,406,567 | * 4/1995 | Ogawa | 714/724 |
| 5,627,839 | * 5/1997 | Whetsel | 714/726 |
| 5,648,973 | 7/1997 | Mote, Jr. | 371/223 |
| 5,696,771 | * 12/1997 | Beausang et al. | 714/726 |
| 5,706,296 | * 1/1998 | Whetsel | 714/726 |
| 5,710,779 | * 1/1998 | Whetsel | 714/726 |
| 5,764,079 | 6/1998 | Patel et al. | 326/40 |
| 5,905,737 | * 5/1999 | Osawa et al. | 714/726 |

* cited by examiner

Primary Examiner—Christine T. Tu
Assistant Examiner—Joseph D. Torres
(74) Attorney, Agent, or Firm—Thomas Schneck; John P. McGuire, Jr.

(57) ABSTRACT

A circuit for parametric testing of I/O's including bidirectionals includes logic which ties the I/O's into a single test chain. A pulse is applied moved down the chain to test the switching levels of the input buffers and the output buffers. The circuit features the ability to program the bidirectionals as either inputs (test mode 1) or outputs (test mode 2) and so allows for its input and output buffers to be tested. The test mode can be selected simply by writing to an externally accessed data register.

11 Claims, 4 Drawing Sheets

APPARATUS AND METHOD FOR PROGAMMABLE PARAMETRIC TOGGLE TESTING OF DIGITAL CMOS PADS

TECHNICAL FIELD

The present invention relates generally to the field of digital CMOS devices, and more specifically to an apparatus and method for verifying electrical parameters of the I/O drivers of an integrated circuit.

BACKGROUND ART

While an integrated circuit (IC) may have been thoroughly tested before being assembled onto a printed circuit board, a board level test is usually still needed to verify that the IC has not been damaged during assembly, for example, by electrostatic discharge which may destroy the driver (buffer) coupled to an input/output pad. It is also necessary to test at the board level to ensure that there are no shorts or open circuits on the I/O pads.

Typically, a single power bus provides power to all of the I/O drivers. It is therefore important to test the power distribution among the drivers to ensure they perform adequately. A parametric test is an indispensable item in making such a determination. In the parametric test, electric characteristics (e.g., input and output current characteristics) of peripheral cells such as input and output buffers, provided on the periphery of a logic device, are tested.

Known methods of testing for these failures generally involve providing a complex, time consuming, set of patterns to get the logic on the pads to desired states for testing purposes. For example, it is known to provide a serial scan path through an integrated circuit device for testing purposes. A carefully designed sequence of data is driven through the serial scan path to test logic functions. Other approaches require additional external pins to put the device in a test mode. This approach is wasteful of pins, since these tests typically either take place only during the manufacturing process and/or are performed infrequently.

Boundary scan techniques also have been developed to address this issue. A boundary scan-capable device has the following structure: A peripheral cell area of an IC chip includes memory circuits for use in test, each connected to a signal line connected to an external terminal. The memory circuits are connected to each other, resulting in a shift register which serves as a testing structure. With such IC chips mounted on a board, a functional test is performed by utilizing the testing structure. Each of the IC chips has a data input terminal, a data output terminal, and a test control terminal. The terminals of the IC chips are connected so as to perform a desired test. Data for use in a test is serially input through the data input terminal of an IC chip, subjected to a serial shift operation by a control signal, and serially output through the data output terminal. In this manner, data can be written in and read out from memory circuits. In other words, the serial shift operation of the test data allows an individual test for each of the IC chips. However, devices which incorporate boundary scan circuitry increase the unit cost of the device, and more significantly such circuitry consumes valuable silicon real estate.

What is needed is a way to test the I/O drivers on IC pads at the board level without requiring complex test patterns. There is a need to provide parametric test within a few vectors on a tester. It is desirable to provide such testing with a minimal requirement of IC silicon. There is also a need to provide an I/O pad testing scheme without having to define additional dedicated pins on the chip.

SUMMARY OF THE INVENTION

An IC device having parametric testing capability includes core logic, input and output drivers, coupling circuitry associated with each of the inputs to the core logic, and selector circuitry associated with each of the outputs from the core logic. Each of the coupling circuitry and selector circuitry has first and second inputs and an output. Each input to the core logic is coupled to the first input of its associated coupling circuit. Each output from the core logic is coupled to the first input of its associated selector circuit. The coupling and selector circuitry are connected to form a single test chain, wherein the output of each coupling circuit feeds into the second input of another coupling circuit or a selector circuit, and wherein the second input of each selector circuit is coupled to the second input of another selector circuit or a coupling circuit.

BEST MODE FOR CARRYING OUT THE INVENTION

Figure 1:
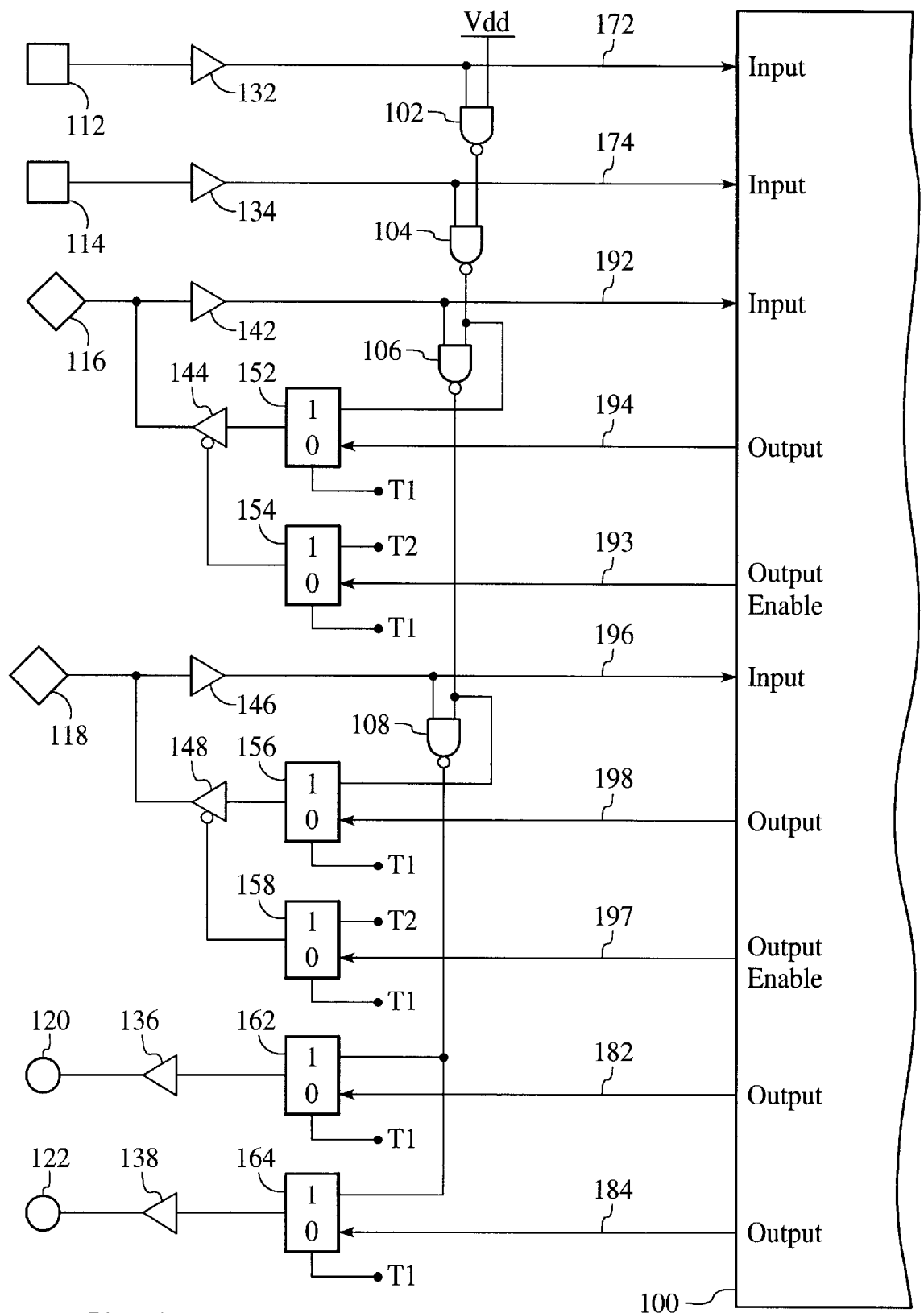
FIG. 1 shows a preferred embodiment of the circuitry in accordance with the invention.

Referring to a preferred embodiment of the invention schematically shown in FIG. 1, a digital integrated circuit (IC) device comprises a core logic 100 having a plurality of I/O lines. Included are "pure" inputs 172 and 174 (input-only lines), "pure" outputs 182 and 184 (output-only lines), and bidirectionals. Each bidirectional consists of a set of lines, for example an input line 192, an output line 194 and an output enable line 193. FIG. 1 shows a second set of bidirectional lines 196–198. It should be noted, of course, that FIG. 1 is merely an illustrative example of a typical IC device, as actual devices usually consist of many more I/O lines than are shown. Also not shown, but which are understood to be present, are utility lines such as power supply lines and ground lines.

The input-only lines 172 and 174 are coupled to input drivers (buffers) 132 and 134 respectively, which in turn are coupled to input pads 112 and 114. The output-only lines 182 and 184 are coupled to the "0" inputs of mux's 162 and 164 respectively. The outputs of mux's 162 and 164 are coupled to output drivers (buffers) 136 and 138 respectively, the outputs of which are coupled to output pads 120 and 122.

With respect to bidirectional line set 192–194, the input line 192 is coupled to an input driver 142, whose input is coupled to a pad 116. The output line 194 is coupled to the "0" input of mux (selector) 152. The output of mux 152 is coupled to an output driver 144, the output of which is also coupled to pad 116. The output enable line 193 is coupled to the "0" input of mux 154, the output of which is coupled to the output enable line of output buffer 144.

With respect to bidirectional line set 196–198, the input line 196 is coupled to an input driver 146, whose input is coupled to a pad 118. The output line 198 is coupled to the "0" input of mux 156. The output of mux 156 is coupled to an output driver 148, the output of which is also coupled to pad 118. The output enable line 197 is coupled to the "0" input of mux 158, the output of which is coupled to the output enable line of output buffer 148.

A plurality of NAND gates 102–108 are associated with the input-only lines 172 and 174 and with the input lines 192 and 196 of bi-directional line sets 192–194 and 196–198. A first input of NAND gate 102 is coupled to input line 172. Similarly, a first input of NAND gate 104 is coupled to input line 174. First inputs of NAND gates 106 and 108 are respectively coupled to input lines 192 and 196 of the bidirectionals.

The outputs of each NAND gate is coupled to the input of an adjacent gate. Thus, the output of gate 102 is coupled to a second input of gate 104, the output of gate 104 in turn is coupled to a second input of gate 106, and the output of gate 106 is coupled to a second input of gate 108. NAND gate 108 is coupled to the second inputs of mux's 162 and 164. Referring back to NAND gate 104, it can be seen that its output is also coupled to the second input of mux 152, while the output of NAND gate 106 is also coupled to the second input of mux 156.

Completing the discussion of FIG. 1, each of mux's 152–164 are controlled by a test control line T1. In addition, the "1" inputs of mux's 154 and 158 are tied to a second test control line T2.

Figure 2:
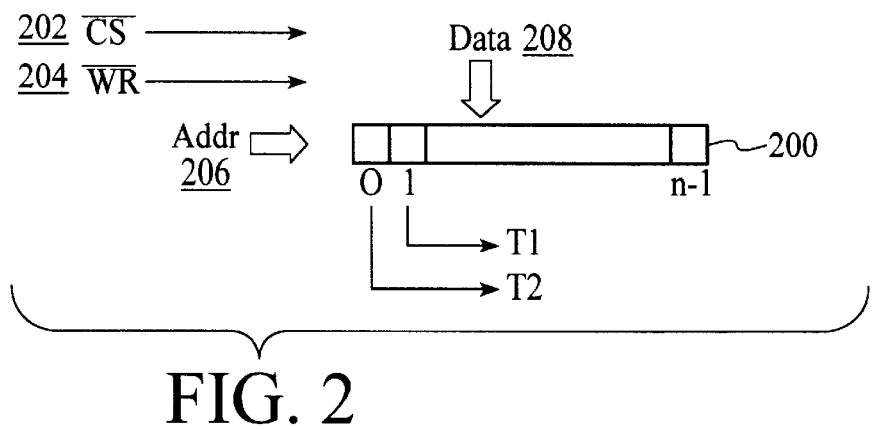
FIG. 2 is a data register for setting the test mode.

The origins of test control signals T1 and T2 will now be discussed with reference to FIG. 2. An n-bit register 200 is provided in the core logic 100 which is accessed in a conventional manner by setting up its address on address lines 206. Bit 0 and bit 1 of register 200 are tied to control lines T2 and T1 respectively. The bits are set and reset as needed in a conventional manner simply by setting up the appropriate data on data lines 208 and writing to register 200, which is accomplished by asserting a chip select (CS) pin 202 and a write (WR) pin 204. Resetting the chip will clear the register and put the device in normal operating mode.

Figure 3:
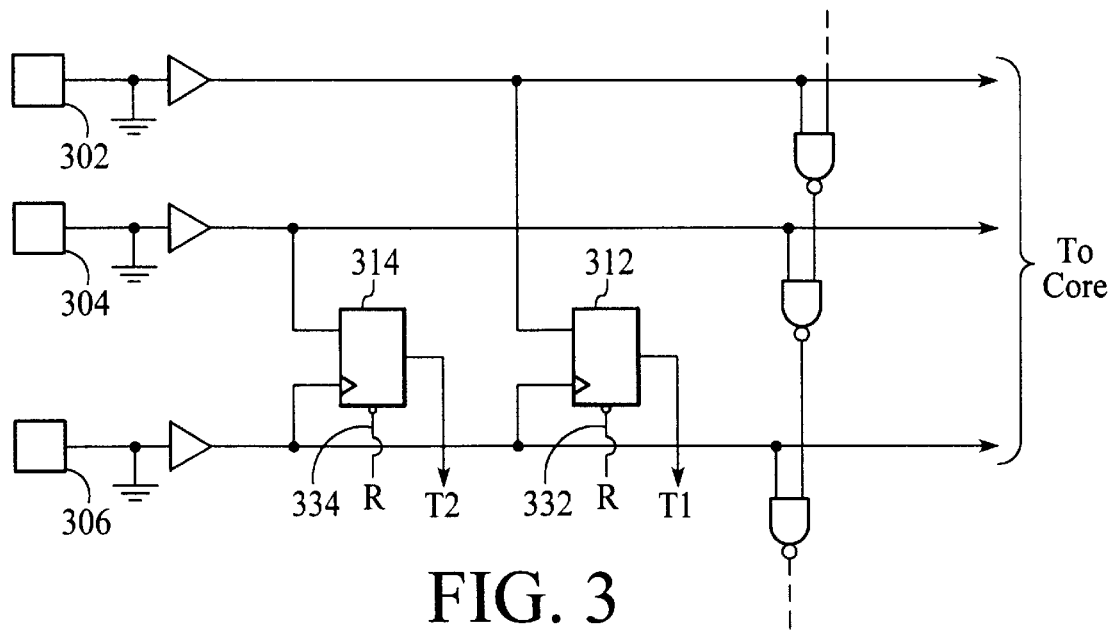
FIG. 3 shows an alternate scheme for setting the test mode.

Referring to FIG. 3, an alternative method of setting control lines T1 and T2 is shown. Here, two of the input pads 302 and 304 are tied to latches 312 and 314 respectively, the outputs of which are lines T1 and T2. A third input pad 306 is tied to clock inputs of the latches. The latches 312 and 314 are resetable, as shown by reset pins 332 and 334 respectively. If pads 302, 304 and 306 are constructed on-chip as pull-down pads, the pads need not be bonded to the chip package. Control signals T1 and T2 are set by setting the desired logic levels at pads 302 and 304, and asserting pad 306 to latch the data to signal lines T1 and T2. The alternate embodiment shown in FIG. 3 illustrates that signals T1 and T2 can be produced in other ways, wherein the I/O pads defined for the particular semiconductor device are directly used to set control lines T1 and T2. The embodiment of FIG. 2 is preferred for the fact that a register access mechanism is typically a part of the functionality of the core logic, and so the structure is already in place for providing a means for producing control signals T1 and T2.

Figure 4:
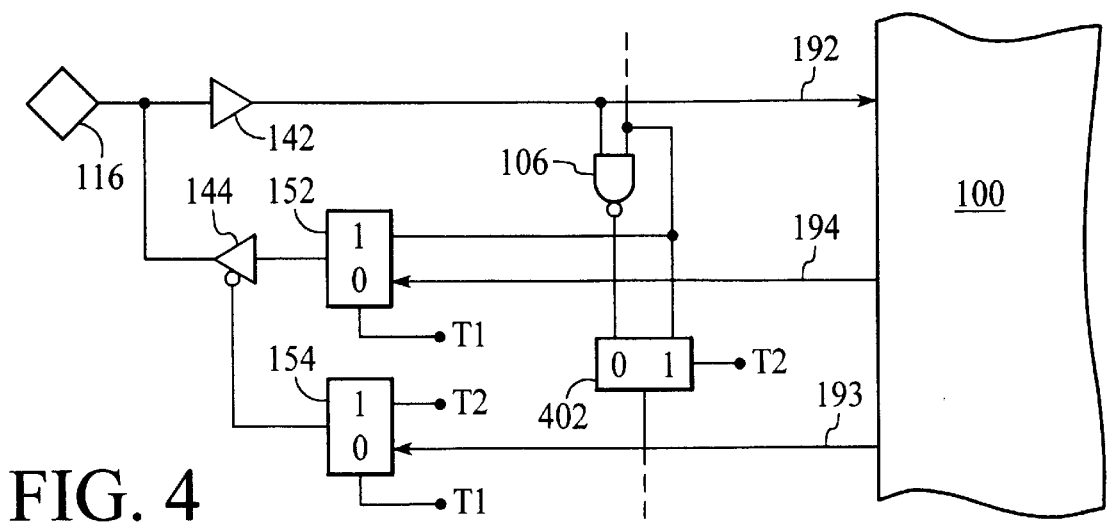
FIG. 4 shows an alternate scheme for coupling the bidirectionals in the test chain.

Referring to FIG. 4, an alternative embodiment for configuring the bidirectional line set in accordance with the present invention is shown. FIG. 4 shows a portion of FIG. 1 pertaining to bidirectional line set 192–194, identifying common circuit elements by the same reference numerals. FIG. 4 includes an additional mux (selector) 402. The "0" input of the mux is coupled to the output of NAND gate 106, while the "1" input of the mux receives the output of a preceding NAND gate (not shown). The selector input of the mux is tied to the T2 signal line. While the embodiment shown in FIG. 4 will work in accordance with the invention, the arrangement shown in the embodiment of FIG. 1 is preferred because it consumes less silicon real estate. The embodiment of FIG. 4 requires an additional mux, whereas the circuit of FIG. 1 does not.

The discussion will turn to the operation of the circuitry of FIG. 1 in accordance with the present invention. First, normal operation of the device occurs when the T1 and T2 control lines are deasserted. In the preferred embodiment, this is accomplished by writing the appropriate bit values into register 200. In normal operating mode, output lines 194 and 198 of the bidirectionals are coupled via mux's 152 and 156 to output drivers 144 and 148 respectively. Similarly, output drivers 136 and 138 are coupled to output-only lines 182 and 184 via mux's 162 and 164.

When toggle testing of the pads is desired, the T1 and T2 control lines are set accordingly. There are two test modes: In test mode 1, bidirectional pads 116 and 118 are programmed to function as input pads. This is accomplished by asserting signal T1 and signal T2. Asserting signal T1 has no effect on input drivers 132 and 134. However, output drivers 136 and 138 are cut off from output lines 182 and 184 of the core logic 100, and coupled to the "1" input of mux's 162 and 164 respectively. Output drivers 144 and 146 of the bidirectionals are cut off from output lines 194 and 198, and coupled to the "1" input of mux's 152 and 156. Similarly, the output enable of drivers 144 and 148 are coupled to the T2 signal line via mux's 154 and 158. However, since T2 is deasserted in test mode 1, output drivers 144 and 148 are tristated. The bidirectionals are therefore configured as inputs in test mode 1.

In test mode 2, bidirectional pads 116 and 118 are programmed to function as output pads. This is accomplished by asserting signal T1 and deasserting signal T2. The effect of asserting signal T1 has been described in the foregoing. Deasserting signal T2 has the added effect of enabling output drivers 144 and 148 of the bidirectionals via the respective mux's 154 and 158. Thus, whatever appears at the "1" inputs of mux's 152 and 156, in this case the outputs of NAND gates 104 and 106 respectively, will be driven onto pads 116 and 118 via drivers 144 and 148. The bidirectionals are therefore configured as outputs in test mode 2.

Parametric toggle testing of the pads in accordance with the invention begins by selecting the desired test mode (test mode 1, test mode 2) as discussed above. Next, a single low pulse is applied to the input pad at the top of the chain shown in FIG. 1. Thus, all the input pads (including the bidirectionals if in test mode 1) are asserted HI while the first input pad is asserted LO. The pulse will propagate down the chain, being delayed by each NAND gate along the way and eventually reaching the output pads. This is repeated for each input pad, wherein the low pulse is applied to the next input pad. The result is that the switching levels ($v_{iL}$ and $V_{ih}$) of each input driver will be tested, and the switching levels ($v_{oL}$ and $v_{oh}$) of the output drivers will be toggled.

From the foregoing, it is observed that the test chain must begin with an input-only pad. Having an output-only pad at the beginning of the chain, of course, prevents parametric testing of that pad. Similarly, having a bidirectional at the beginning of the chain prevents testing of the bidirectional pad in the output mode (test mode 2), though testing of such a pad in the input mode (test mode 1) would be possible. A similar constraint is placed on the end of the chain, namely that the chain must end with an output-only pad. Terminating the chain with an input-only pad prevents that pad from being tested. Likewise, terminating the chain with a bidirectional pad prevents testing of the pad in test mode 1, though testing of the pad in test mode 2 would still work. Finally, it is noted that the circuitry of the present invention permits any ordering of pads between the beginning and the end of the chain. This fact is illustrated in the embodiments of FIGS. 5 and 6.

Figure 5:
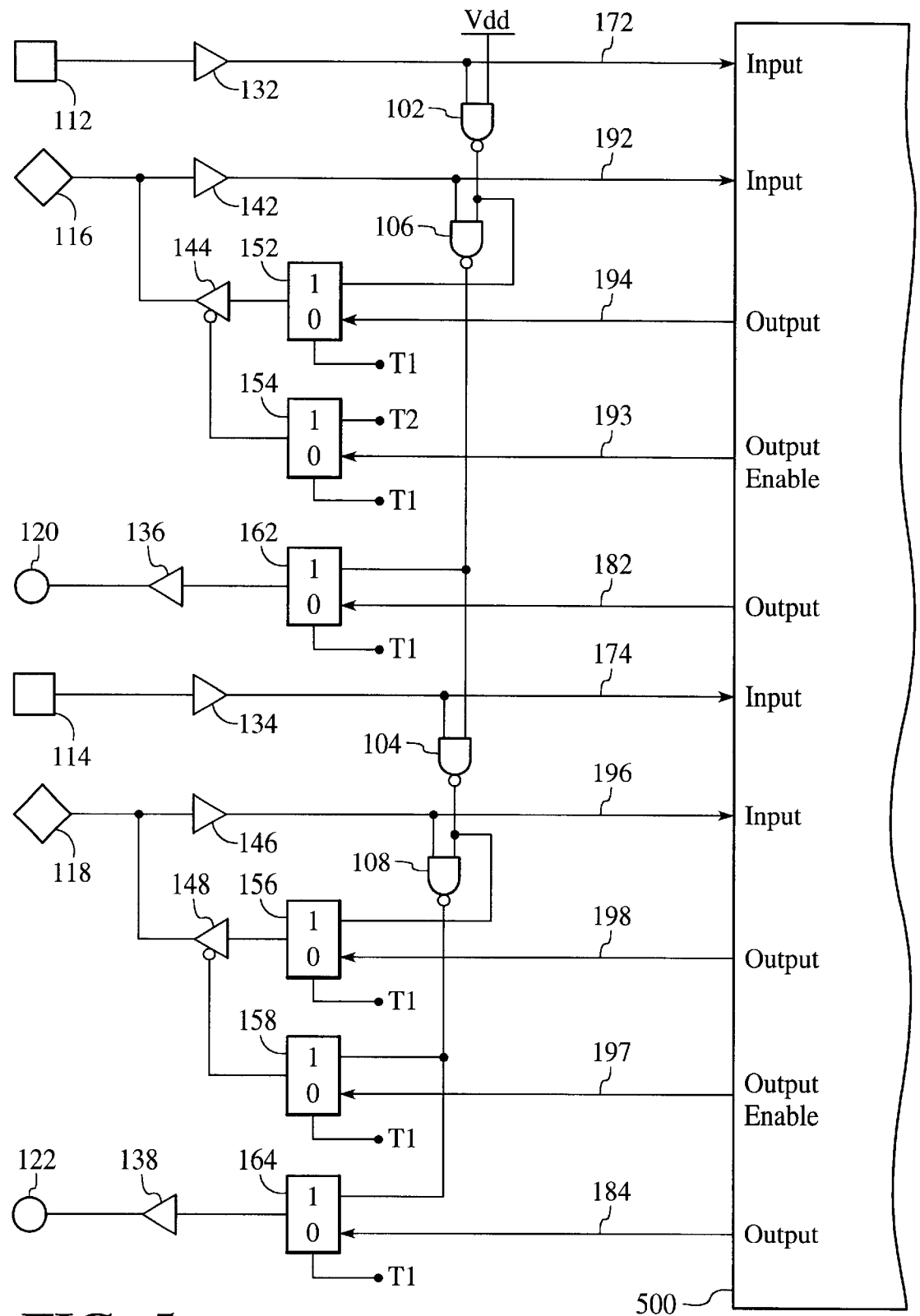
FIGS. 5 and 6 illustrate how the circuitry of the invention is independent of the ordering of the I/O pads.
Figure 6:
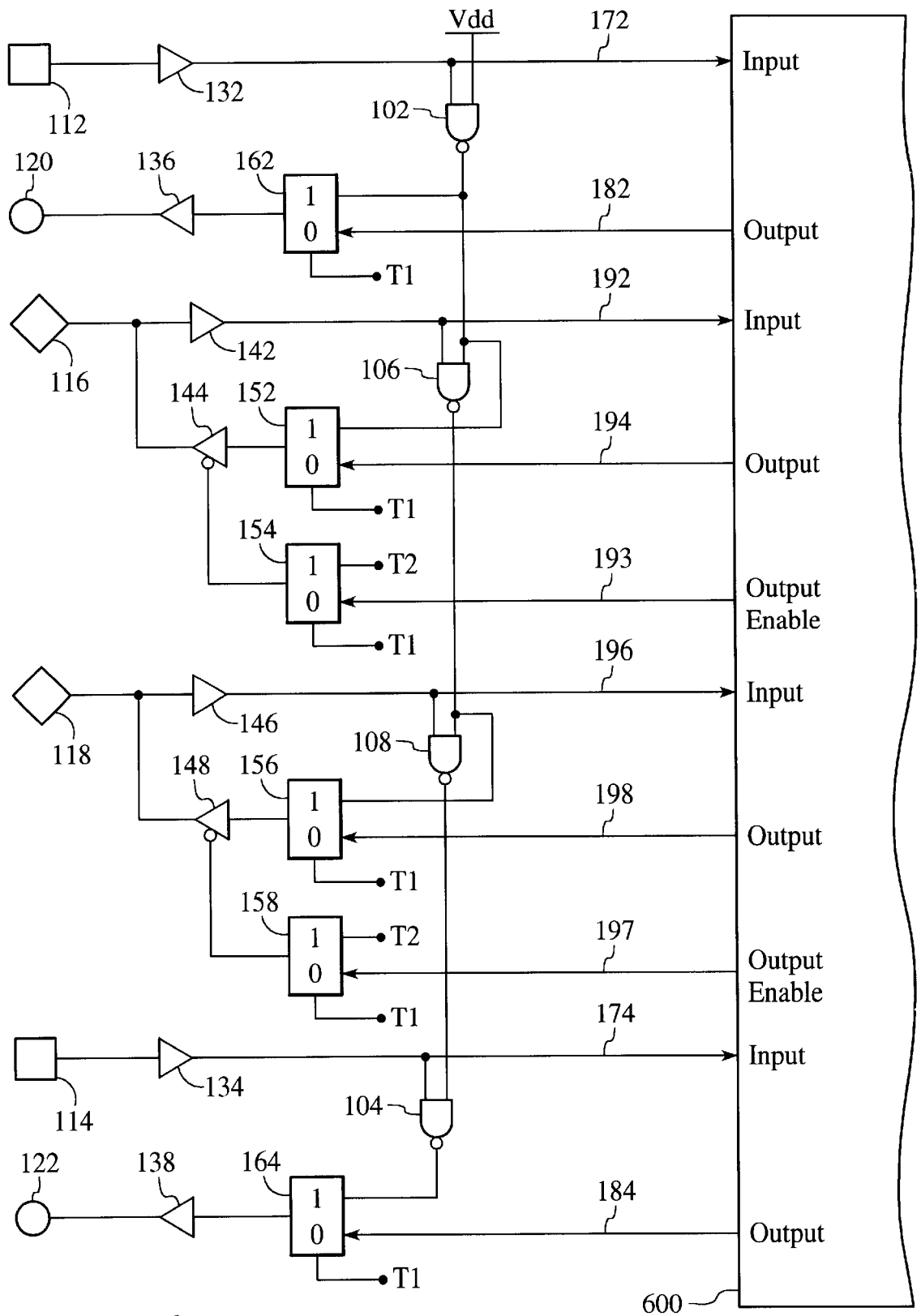

FIGS. 5 and 6 show that the bidirectionals can be interspersed with input-only pads and output-only pads. It is also shown that the output-only pads do not have to be grouped at the end of the chain. Conversely, the input-only pads do not have to be grouped at the beginning of the chain. This freedom of ordering permits the layout of the logic to be made without the artificial constraints normally imposed by parametric testing requirements. The I/O's can be placed in any order that is convenient for the layout of the functional blocks comprising the core logic. The only requirement is that the chain begins with an input-only pad and terminates in an output-only pad. Even this constraint can be loosened to allow bidirectionals to be located at the beginning or end of the chain, keeping in mind that a bidirectional at the beginning cannot be tested as an output and a bidirectional at the end cannot be tested as an input.

Another advantage of the invention is that only a few vectors are needed to fully test the switching levels of all of the I/O pads. In fact, only as many vectors as there are input pads are required. Moreover, both the input and the output drivers for the bidirectional pads can be tested by this scheme. The use of an addressable data register for setting test control signals T1 and T2 obviates the need for additional test mode pins that would otherwise consume valuable silicon real estate. The test mode is selected simply by writing to the register.

What is claimed is:

1. A test circuit adapted for testing input and output circuitry of an integrated circuit (IC), the IC comprising input-only lines, output-only lines and bidirectional line sets, each bidirectional line set comprising an input line, an output line and an output enable line, the test circuit comprising:

a plurality of first coupling circuits, each being associated with one of the input-only lines, each first coupling circuit having first and second inputs and an output, the first input of each first coupling circuit being connected to its associated input-only line;

a plurality of first selector circuits, each being associated with one of the output-only lines, each first selector circuit having first and second inputs, an output and a control input adapted to selectively couple the output to the first input or the second input, the first input of each first selector circuit being connected to its associated output-only line;

a plurality of second coupling circuits, each being associated with one of the bidirectional line sets, each second coupling circuit having first and second inputs and an output, the first input of each second coupling circuit being connected to the input line of its associated bidirectional line set; and a plurality of second selector circuits, each being associated with one of the bidirectional line sets, each second selector circuit having first and second inputs, an output and a control input adapted to selectively couple the output to the first input or the second input, the first input of each second selector circuit being connected to the output line of its associated bidirectional line set; and a test select signal line coupled to the control input of each of the first and second selector circuits;

all of the coupling and selector circuits arranged to form a single test chain, wherein a beginning circuit of the test chain is one of the first coupling circuits, wherein the outputs of the first and second coupling circuits each is coupled to the second input of one of the coupling circuits or one of the selector circuits, wherein the second inputs of the first and second selector circuits each is coupled to the second input of one of the coupling circuits or one of the selector circuits, and wherein an ending circuit of the test chain is one of the first selector circuits.

2. The test circuit of claim 1 further including means for asserting and deasserting a logic state on the test select signal line.

3. The test circuit of claim 1 further including a data register having a plurality of bits, a first of the bits being coupled to the test select signal line; whereby the first and second selector circuits are operated by writing a datum into the data register to set or reset the first bit in the data register.

4. The test circuit of claim 1 further including a plurality of third selector circuits, each having first and second inputs, an output and a control input adapted to selectively couple the output to the first input or the second input, each third selector circuit being associated with one of the bidirectional line sets, the first input of each third selector circuit being connected to the output enable line of its associated bidirectional line set, the control input of each third selector circuit being connected to the test select line; the test circuit further having a second test select signal line coupled to the second input of each of the third selectors.

5. The test circuit of claim 4 further including first means for asserting and deasserting a logic value on the test select signal line and second means for asserting and deasserting a logic value on the second test select signal line.

6. The test circuit of claim 4 further including a data register having a plurality of bits, a first of the bits being coupled to the test select signal line, a second of the bits being coupled to the second test select signal line; whereby the selector circuits are operated by writing a datum into the data register to set or reset the first and second bits of the data register.

7. The test circuit of claim 1 wherein the second input of the beginning circuit is coupled to a power supply line.

8. A digital IC device having logic to facilitate parametric testing of the I/O buffers thereof, the IC device comprising:

a plurality of input pads, output pads and bidirectional pads;

a plurality of input buffers, each having an input terminal connected to one of the input pads or to one of the bidirectional pads, each further having an output terminal;

a plurality of first output buffers, each having an output terminal connected to one of the output pads, each further having an input terminal;

a plurality of second output buffers, each having an output terminal connected to one of the bidirectional pads, each further having an input terminal and an output enable terminal;

enabling means coupled to the output enable terminals for asserting enabling signals on selected ones of the second output buffers;

a core logic having a plurality of core inputs, core outputs, each core input connected to the output terminal of one of the input buffers;

a plurality of coupling circuits, each having a first input connected to one of the core inputs, each further having a second input and an output;

a plurality of selector circuits, each having first and second inputs and an output, each further having a selector input which controls whether the first or the second input is connected to the output, the first input of each selector circuit connected to one of the core outputs, the output of each connected to the input terminal of one of the first output buffers or one of the second output buffers; and circuit means for asserting a selector signal, the means having an output terminal connected to the selector input of each of the selector circuits;

the coupling circuits and the selector circuits connected to form a single chain of circuits, the first circuit in the chain being a coupling circuit, the last circuit in the chain being a selector circuit, wherein the output terminal of each coupling circuit is connected to the second input of another coupling circuit or of one of the selector circuits, wherein the second input terminal of each selector circuit is connected to the second input of another selector circuit or of one of the coupling circuits.

9. The IC device of claim 8 wherein the circuit means is an addressable data register having at least one bit that is coupled the selector input of each of the selector circuits.

10. The IC device of claim 8 wherein the second input of the first circuit is connected to a power supply line.

11. The IC device of claim 8 wherein the enabling means comprises a plurality of control lines originating from the core, each control line having an associated second selector circuit, each second selector circuit having first and second inputs, an output and a selector terminal; wherein the first input of each second selector circuit is connected to one of the output enable lines, the selector terminal is connected to the output of the circuit means, and the output is connected to the output enable terminal of one of the second output buffers; the IC device further including second circuit means for asserting a second selector signal, the second circuit means having an output coupled to the second input of each second selector circuit.

* * * * *